United States Patent
Rostron et al.

(10) Patent No.: US 10,551,440 B2
(45) Date of Patent: Feb. 4, 2020

(54) RFID STATUS MONITOR FOR HIGH VOLTAGE AND REMOTE ELECTRIC POWER SYSTEMS

(71) Applicant: Southern States, LLC, Hampton, GA (US)

(72) Inventors: Joseph R Rostron, Hampton, GA (US); Josh Keister, Hampton, GA (US); Tan T Tran, Hampton, GA (US); Philip Carson Jones, Hampton, GA (US)

(73) Assignee: Southern States, LLC, Hampton, GA (US)

( * ) Notice: Subject to any disclaimer, the term of this patent is extended or adjusted under 35 U.S.C. 154(b) by 0 days.

(21) Appl. No.: 16/132,676

(22) Filed: Sep. 17, 2018

(65) Prior Publication Data

US 2019/0018064 A1     Jan. 17, 2019

Related U.S. Application Data

(63) Continuation-in-part of application No. 15/876,074, filed on Jan. 19, 2018, now abandoned.

(Continued)

(51) Int. Cl.

| | |
|---|---|
| *G01R 31/327* | (2006.01) |
| *G06K 7/10* | (2006.01) |
| *H01H 9/16* | (2006.01) |
| *H01H 31/28* | (2006.01) |
| *H01H 33/53* | (2006.01) |

(Continued)

(52) U.S. Cl.
CPC ..... *G01R 31/3272* (2013.01); *G01R 31/3275* (2013.01); *G06K 7/10366* (2013.01); *H01H 9/168* (2013.01); *H01H 31/28* (2013.01); *H01H 33/20* (2013.01); *H01H 33/53* (2013.01); *H01H 2300/032* (2013.01); *H04Q 9/00* (2013.01);

(Continued)

(58) Field of Classification Search
CPC .. H04Q 9/00; H04Q 2209/00; H04Q 2209/10; H04Q 2209/20; H04Q 2209/47; H04Q 2209/60; H04Q 2209/80; G01R 31/327; G01R 31/3271; G01R 31/3272; G01R 31/3275; G06K 7/10366; H01H 33/20; H01H 33/53; H01H 9/168; H01H 31/28; H01H 2300/032
See application file for complete search history.

(56) References Cited

U.S. PATENT DOCUMENTS 7,295,133 B1 * 11/2007 McCollough, Jr. ...... H04Q 9/00
                                                             324/126
8,560,256 B2 * 10/2013 Gu ......................... G01D 4/002
                                                             702/116

* cited by examiner

*Primary Examiner* — Franklin D Balseca
(74) *Attorney, Agent, or Firm* — Mehrman Law Office; Michael J. Mehrman

(57) ABSTRACT

A remote blade closing detector switch is positioned on or near the jaws of an electric power disconnect switch, where proper seating of the blade in the jaws activates a detector switch. An extended conductor lead electrically connects the detector switch an RFID tag placed in a convenient reading location. The detector switch is configured to control a data signal, power to the antenna of the RFID tag, the power supply to the RFID tag, or a data signal between an RFID chip and an antenna as mechanisms for enabling and disabling the tag to report a status indicator. An antenna tuning compensator may be utilized to compensate for the impedance of the long conductor lead connected to the antenna. A noise filter may also be used to suppress electrical noise picked up by the long conductor lead in the harsh electrical environment of the disconnect switch.

20 Claims, 10 Drawing Sheets

Related U.S. Application Data

(60) Provisional application No. 62/448,592, filed on Jan. 20, 2017.

(51) Int. Cl.
 *H01H 33/20* (2006.01)
 *H04Q 9/00* (2006.01)

(52) U.S. Cl.
 CPC ..... *H04Q 2209/00* (2013.01); *H04Q 2209/10* (2013.01); *H04Q 2209/47* (2013.01)

RFID STATUS MONITOR FOR HIGH VOLTAGE AND REMOTE ELECTRIC POWER SYSTEMS

REFERENCE TO RELATED APPLICATION

This application claims priority to U.S. patent application Ser. No. 15/876,074 filed Jan. 19, 2018, which claims priority to U.S. Provisional Application Ser. No. 62/448,592 filed Jan. 20, 2017, which are both incorporated by reference.

TECHNICAL FIELD

The present invention is directed to electric power systems and, more particularly, to an RFID status monitor suitable for high voltage and remote electric power components and systems.

BACKGROUND

Controllable RFID tags have been used to monitor the status of various devices for decades. However, the conventional approaches for changing a status indicator stored on an RFID chip do not work well in many high voltage electric power applications due to the high level of electromagnetic noise in electric power substations. In addition, switch detection locations are often remote from convenient human or RFID tag reading locations. They are also surrounded with large metal components, high voltage electro-magnetic fields, corona discharge and arcing fields that interfere with typical RFID reading systems. For example, it has been found that a conventional RFID detector positioned on the blade arm of an electric power disconnect switch is difficult to read and often does not function acceptably.

There is, therefore, a need for a more effective approach for RFID monitoring in high voltage and remote electric power locations.

SUMMARY

The invention solves the problems described above through an RFID tag placed in a convenient reading location with an extended conductor lead to a detector switch or other sensor located in a harsh high voltage environment. To prevent electromagnetic noise and lead impedance from interfering with signals from the detector switch to the RFID tag, the switch is configured to control a data signal, power to the antenna of the RFID tag, the power supply to the RFID tag, or a data line between an RFID chip and an antenna chip of the RFID tag as mechanisms for enabling and disabling the tag to report a status indicator. In an illustrative embodiment, the RFID tag includes an antenna chip that is physically distinct from an RFID chip, and the detector switch is connected via an extended electric conductor from the detector switch to a data line extending between the antenna chip and the RFID chip. An antenna tuning compensator and/or a noise filter may be connected to the extended electric conductor. In another illustrative embodiment, an extended conductor lead from the detector switch is used to selectively connect a ground conductor in the power supply circuit of an RFID tag, which causes the RFID tag to transmit only when the detector switch is closed. In yet another illustrative embodiment, an extended conductor lead from the detector switch is used to selectively short a capacitor in the power supply circuit of the RFID tag, which causes the RFID tag to transmit only when the detector switch is open.

It will be understood that specific embodiments may include a variety of features in different combinations, as desired by different users. In view of the foregoing, it will be appreciated that the present invention provides a cost-effective status monitoring system for high voltage electric power components. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which.

DETAILED DESCRIPTION

Figure 1:
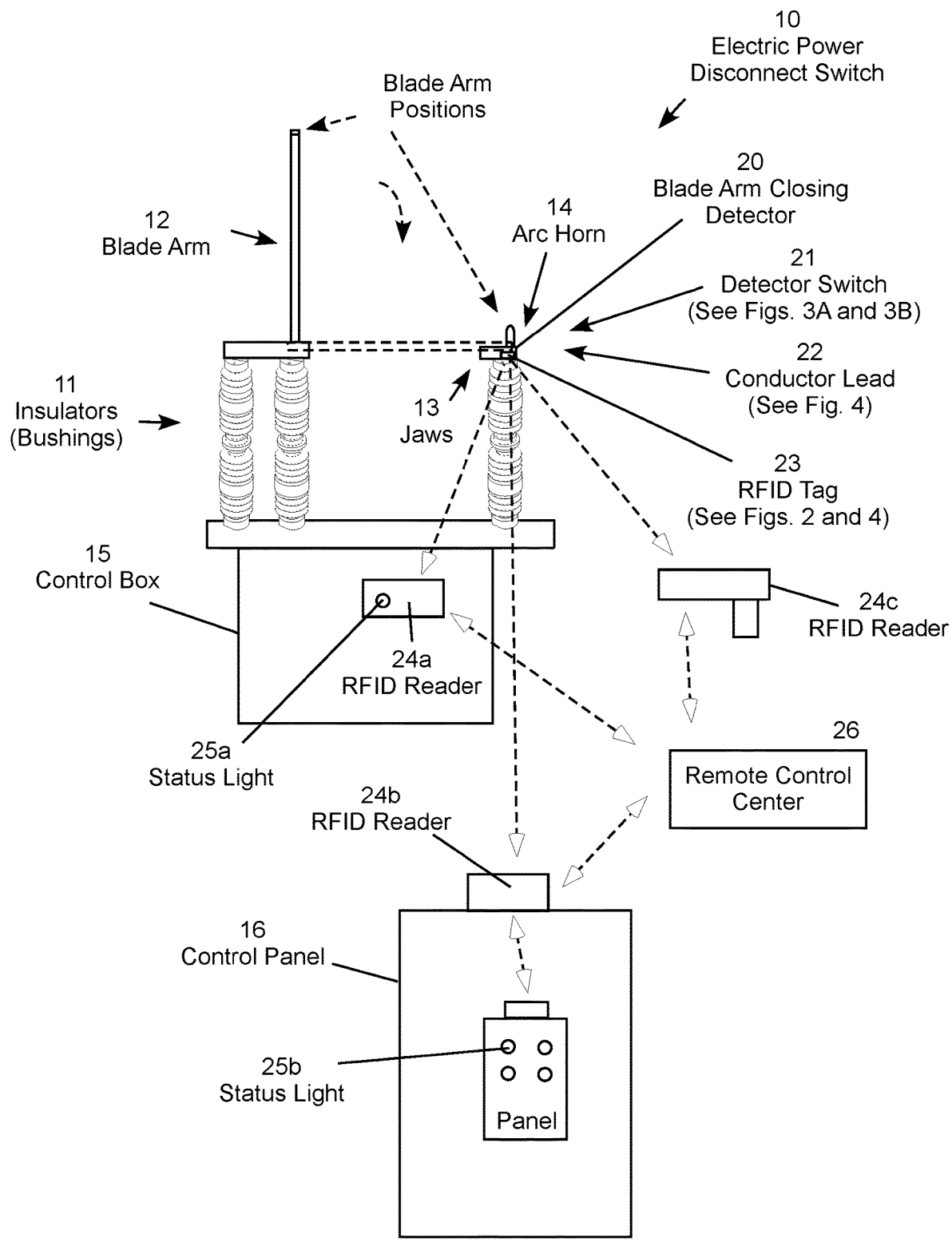
FIG. 1 is conceptual illustration of an electric power disconnect switch blade closing detector with an RFID status monitor.

The embodiments of the invention may be used to detect physical conditions, such as switch positions, in a wide range of high voltage electric power systems. These systems are electrically harsh environments where the devices are typically large and difficult for technicians to visually inspect or read with a handheld reader due to the large sizes of the structures and the high voltages involved. A high voltage disconnect switch provides a good example of the problem to be solved and the innovative solution.

In an illustrative embodiment, a remote blade closing detector switch is positioned on or near the jaws of an electric power disconnect switch, where proper seating of the blade in the jaws activates a detector switch. An extended conductor lead electrically connects the detector switch an RFID tag placed in a convenient reading location.

The detector switch via the extended conductor is configured to control a data signal, power to the antenna of the RFID tag, the power supply to the RFID tag, or a data signal between an RFID chip and an antenna chip as mechanisms for enabling and disabling the tag to report a status indicator. An antenna tuning compensator may be connected to the extended conductor to compensate for the impedance of the long conductor lead connected to the antenna. Additionally or alternatively, a noise filter may be connected to the extended conductor to remove electrical noise picked up by the extended conductor.

The jaws of the electric power disconnect switch is a very noisy electrical environment due to arcing, corona and high voltage fields created by the monitored disconnect switch as well as other disconnect switches and other electric power devices located nearby in the same substation. The conductor lead from the detector switch on to the RFID tag is therefore exposed to extreme electromagnetic noise. The distance from the remote detector switch on or near the jaws to the RFID tag in a convenient reading location may be on the scale of a significant fraction of a meter, while the distance to a local control box or other RFID reading location may be on the order of meters or tens of meters. In addition, the jaws of the electric power disconnect switch, the detector switch, the RFID tag, and the conductor lead from the detector switch to the RFID tag are all maintained at line potential. The RFID reader, on the other hand, is ordinarily maintained at ground potential where it can be safely operated by technicians and connected to other pieces of equipment at ground potential.

In a first embodiment, the detector switch controls a data signal supplied to the RFID tag, and the conductor lead from the detector switch to the RFID tag picks up electromagnetic noise that interferes with the data signal. This problem is solved by connecting an electric noise filter to the conductor lead to suppress the noise to allow the data signal to be properly received by the RFID tag. The conductor lead from the detector switch to the RFID tag also presents a significant impedance, which detunes the antenna on the RFID tag when the lead is connect into the antenna circuit. This problem is solved by connecting an antenna tuning compensator to the conductor lead to properly tune the antenna when the conductor lead is connected to the antenna of the RFID tag.

In a second embodiment, the detector switch controls power to the antenna of the RFID tag. The noise problem is solved by including an electric noise filter connected with the conductor lead to suppress the noise to allow the data signal to be properly received by the RFID tag. The conductor lead from the detector switch to the RFID tag also presents a significant impedance, which detunes the antenna on the RFID tag when the lead is connect into the antenna circuit. This problem is solved by connecting an antenna tuning compensator to the conductor lead to properly tune the antenna when the conductor lead is connected to the antenna of the RFID tag.

In a third technique, the detector switch controls power to the RFID tag. For example, the conductor lead may connect the detector switch to control (i.e., open or close) a ground connection in the power supply circuit of the RFID tag. In this case, the RFID tag receives power only when the detector switch is closed. In another example, the conductor lead may connect the detector switch to control (i.e., open or close) a short to ground around a capacitor in the power supply circuit of the RFID tag. In this case, the RFID tag receives power only when the detector switch is open. This solution works well but may require access to the power supply of the RFID chip. As another option, an external capacitor may be added to the positive power supply terminal of the power supply of the RFID chip. This allows the positive power supply terminal of the power supply of the RFID chip to be selectively shorted by connecting a short around the external capacitor to ground through the detector switch. In this case, the RFID tag receives power only when the detector switch is open. The external capacitor approach is a good option when pin access is available to the positive power supply terminal of the power supply on the RFID chip.

FIG. 1 shows an illustrative example of a typical disconnect switch 10, in which insulators (also known as bushings) 11 support a blade arm 12 that makes arcing contact through ambient air with jaws 13 with an arcing horn 14, which connects to the blade arm when opening and closing the electric power circuit. The disconnect switch 10 typically includes a control box 15 used to operate the blade are 12 and report the position of the bland arm to monitoring equipment, such as the control center of the utility that operated the disconnect switch. The disconnect switch 10 may also be connected to a control panel 16 used to operate or monitor the disconnect switch. For example, disconnect switches of this type are commonly used in distribution substations operating at 34.5 kV and below.

Ice can interfere with the proper seating of the blade arm 12 in the jaws 13, which can result in continuous arcing, damage to the switch, and fire. A blade arm closing detector 20 including a detector switch 21 (shown in FIGS. 3A and 3B) is therefore positioned in or next to the jaws 13 to detect whether the blade 12 is properly seated in the jaws 13. The jaws 13 is located in a harsh electrical environment surrounded by metal and exposed to the weather elements, which makes it a poor location for an RFID tag. The detector switch 21 (shown in FIGS. 3A and 3B) is therefore connected by an extended conductor 22 (shown in FIG. 4) to an RFID tag 23 (shown in FIGS. 2 and 4) located in a more convenient reading location, such as inside or outside the case of the blade closing detector 20, where the tag can be conveniently read by a handheld or other type of RFID reader represented by the example RFID readers 24a, 24b and 24c shown in FIG. 1 The RFID tag 20 may be used to trigger a status light represented by the status lights 25a and 25b shown in FIG. 1 or other type of indicator or alarm. In both cases, the RFID tag may alternatively or additionally communicate a status signal to a remote control center 26, such as an operations center for the electric utility that operates the disconnect switch 10.

It should be appreciated that the control box 15 or actuator for the disconnect switch 10 also typically reports the position of the blade arm 12. The addition of the blade closing detector 20 therefore allows a local or remote monitoring location to determine both when the blade arm is in a lowered position, and whether the blade is properly seated in the jaws. When the blade arm has been lowered but not properly seated in the jaws, appropriate action is required, such as opening the electric power disconnect switch and dispatching a crew to clear the jaws of ice or take other corrective actions.

Figure 2:
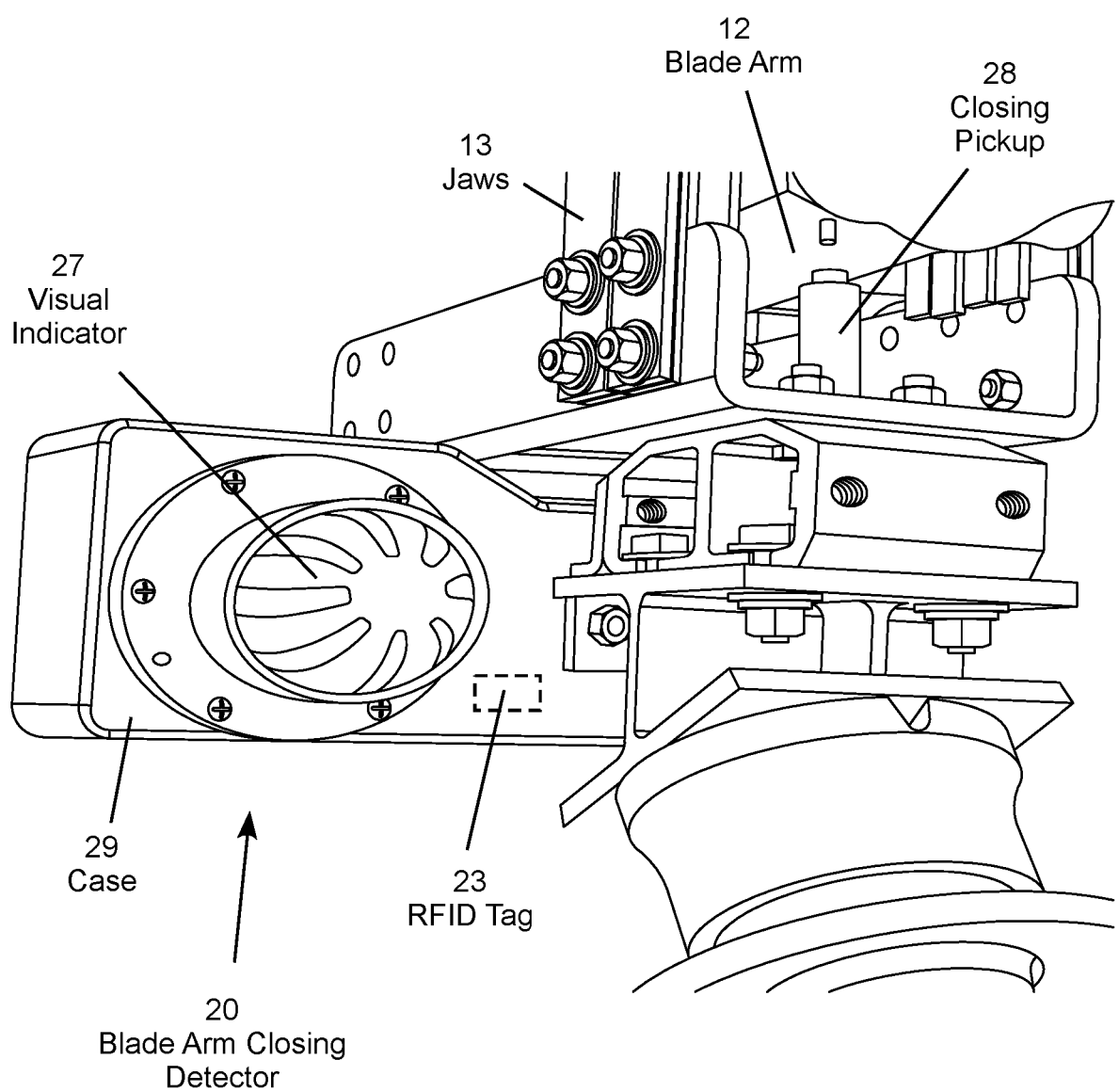
FIG. 2 is a perspective view of the jaws assembly of the disconnect switch blade closing detector.

FIG. 2 shows a detail view of a portion of the electric power disconnect switch 10 including the blade arm closing detector 20 with a visual indicator 27 and a portion of the jaws 13 and blade arm 12. A closing pickup 28 is physically displaced (e.g., pushed downward) when the blade arm is properly seated in the jaws. The closing pickup 28, in turn, moves a detector arm, which operates the blade closing detector switch has shown in FIGS. 3A and 3B. The blade closing detector switch is connected by an extended conductor (e.g., 2-wire pair) to an RFID tag shown in FIG. 4.

Figure 3A:
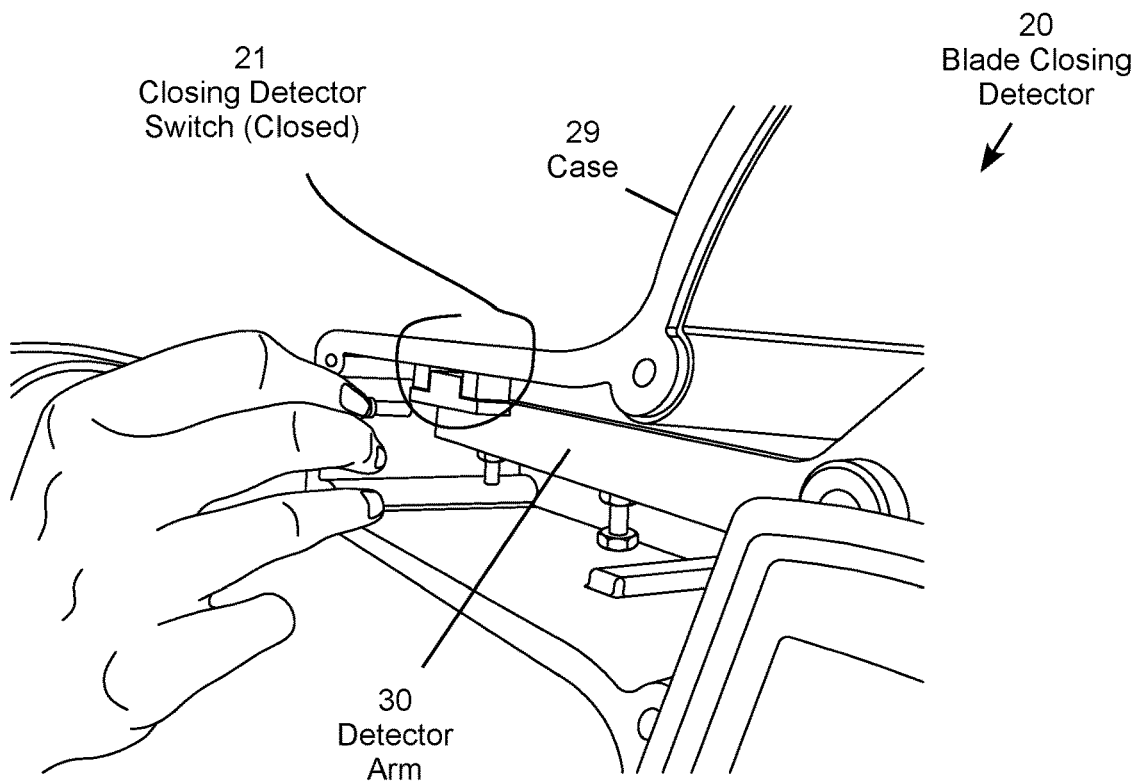
FIG. 3A is a perspective view of the disconnect switch blade closing detector in the closed position.
Figure 3B:
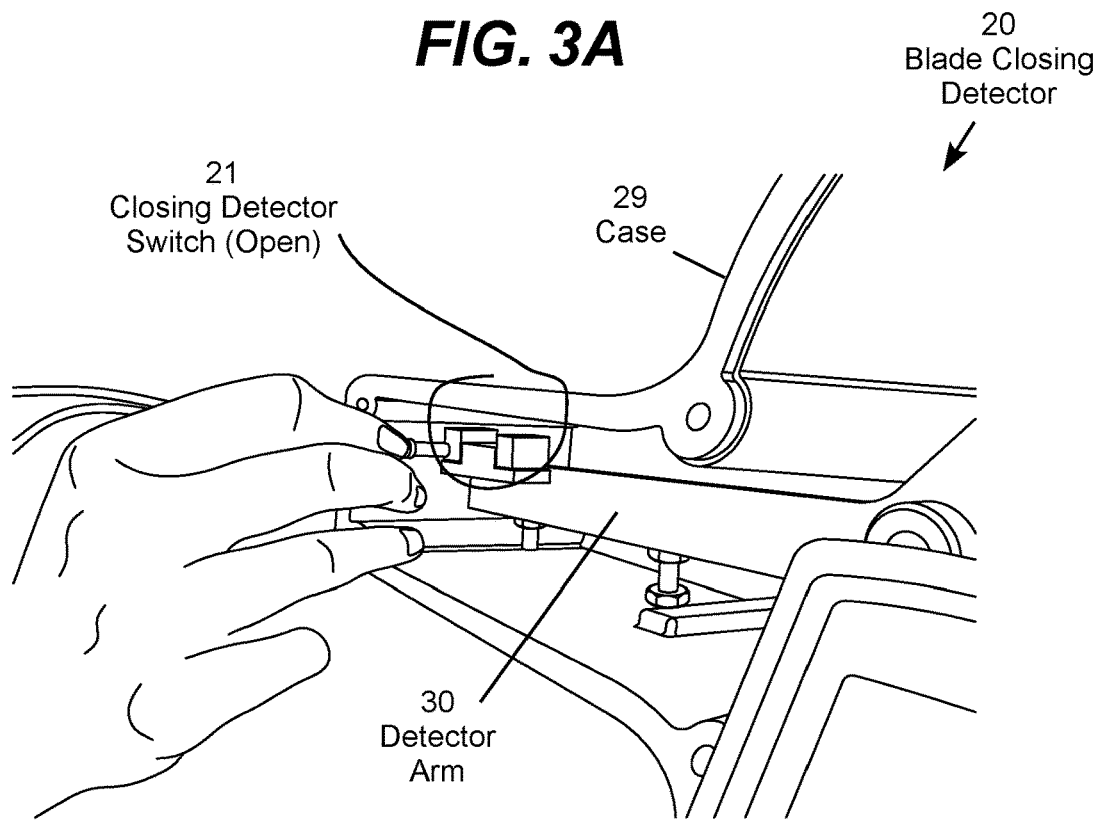
FIG. 3B is a perspective view of the disconnect switch blade closing detector in the open position.

FIGS. 3A and 3B show the blade closing detector 40 including the case 29 housing the detector switch 21 and the detector arm 30. The detector switch 21 includes one contactor connected to the case 29 and a second contactor connected to the detector arm 21. The closing pickup 28 shown in FIG. 2 moves the detector arm 30 to operate the blade closing detector switch 21 from the closed position shown in FIG. 3A to the open position shown in FIG. 3B. The blade closing detector switch 21 in this embodiment is located next to the jaws inside the metal case 29, where it is protected from the weather but difficult to read.

Figure 4:
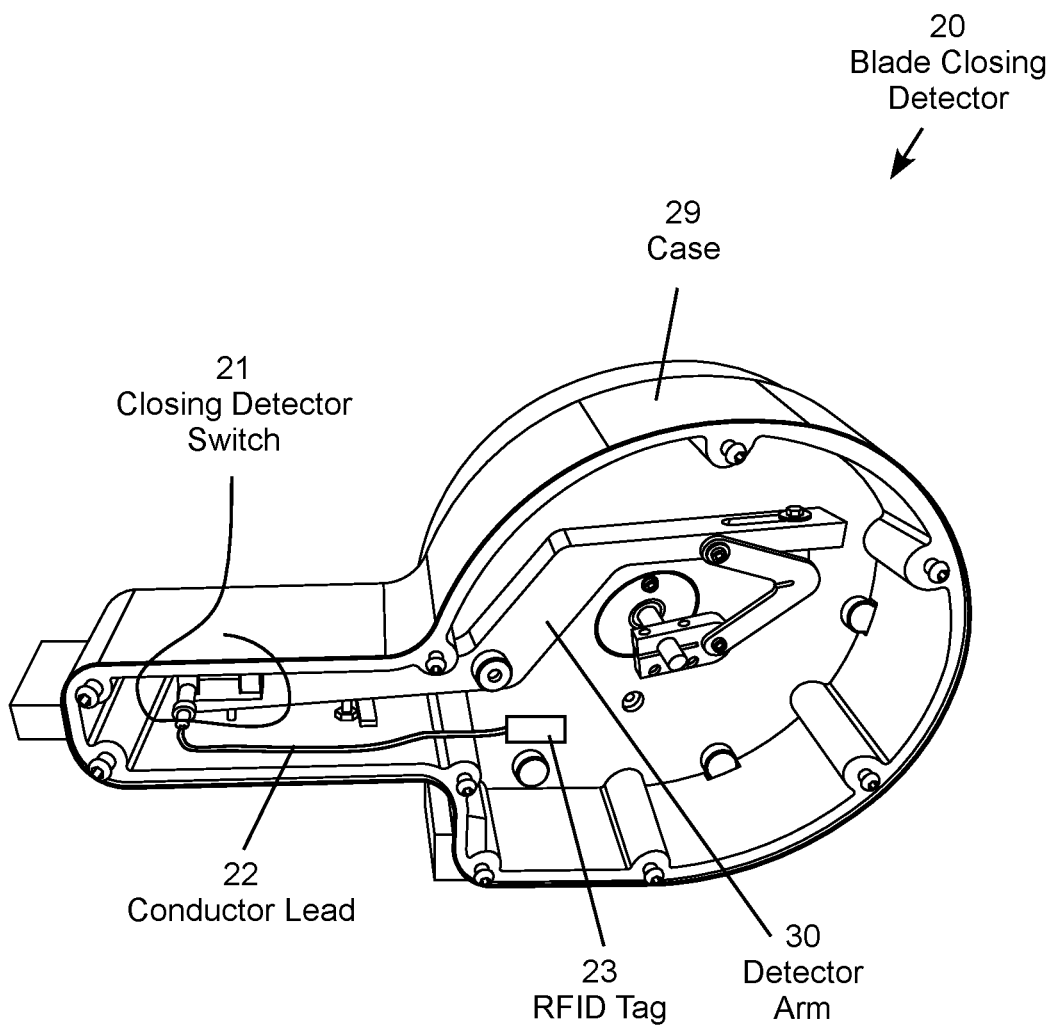
FIG. 4 is a perspective view of the disconnect switch blade closing detector with an extended wire lead for connection to an RFID status monitor.

FIG. 4 shows the blade closing detector 20 including the case 29 that houses the closing detector arm 30, the blade closing detector switch 21, the conductor lead 22, and the RFID tag 23 (also referred to as the "RFID chip"). The extended conductor lead 22 extends from the detector switch 21 to the RFID tag 23, which is located in a convenient reading location, such as the interior or exterior of the case 29. The RFID tag 23 is well positioned for reading from one or more convenient reading locations, such as a technician using a handheld RFID reader, an RFID reader located in a local control box, a RFID reader located in a local control panel, or another suitable location. While these specific locations are illustrated, the RFID reader may be located in any desired reading location including a portion of the disconnect switch, an enclosure, a frame, a pole, an indicator panel, inside a building, and so forth. This configuration presents several challenges to conventional electrical integration techniques including a significant electrical impedance created by the extended conductor lead 22 and electric noise picked up by the conductor in the harsh electrical environment of the high voltage equipment, such as an electric disconnect switch. These challenges are described and resolved below with reference to FIGS. 5-9. While an electric power disconnect switch is illustrated as an example application, the techniques described may be used for any type of detector switch that is located in a remote, shielded, difficult to read, electrically noisy, or other environment lending itself to an extended electric conductor connecting the detector switch from the RFID tag.

Figure 5:
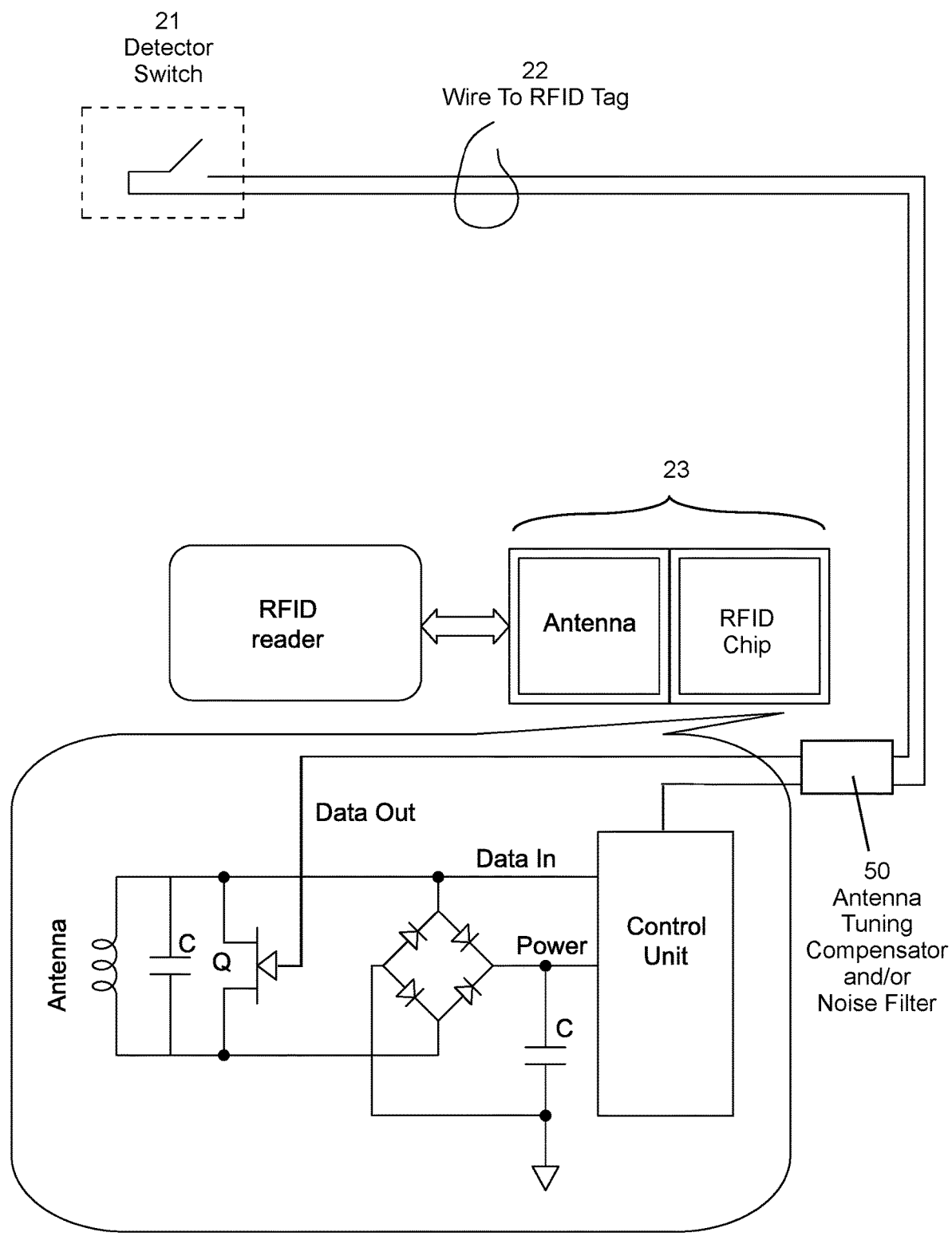
FIG. 5 is a schematic diagram of a first circuit technique for connecting an RFID status monitor to the disconnect switch blade closing detector.

FIG. 5 illustrates a first approach for connecting the detector switch 21 to the RFID tag 23 (RFID chip) by way of the extended conductor 22. In this approach, the extended conductor 22 is connected to a data line of the RFID chip 23. In this embodiment, a data signal used to enable the RFID chip 23 may be supplied when the closing detector switch is in a closed position, or when the closing detector switch is in a closed position, as desired. This approach may not work well without filtering due to the high level of interference picked up by the extended conductor 22 in the harsh electrical environment of the high voltage electric disconnect switch. With this type of connection, the signal-to-noise ratio can be so low that false signals are created and valid signals are masked. A noise filter 50 connected to the conductor 22 may therefore be used to suppress electrical noise and deliver an acceptable data signal from the detector switch 21 to the RFID chip 23. In addition, this approach may not work well because the impedance of the long lead conductor changes the impedance of the antenna, effectively detuning the antenna. An antenna tuning compensator connected to the conductor 22 may therefore be used to properly turn the RFID antenna in the presence of the extended conductor and the detector switch in this antenna configuration.

Figure 6:
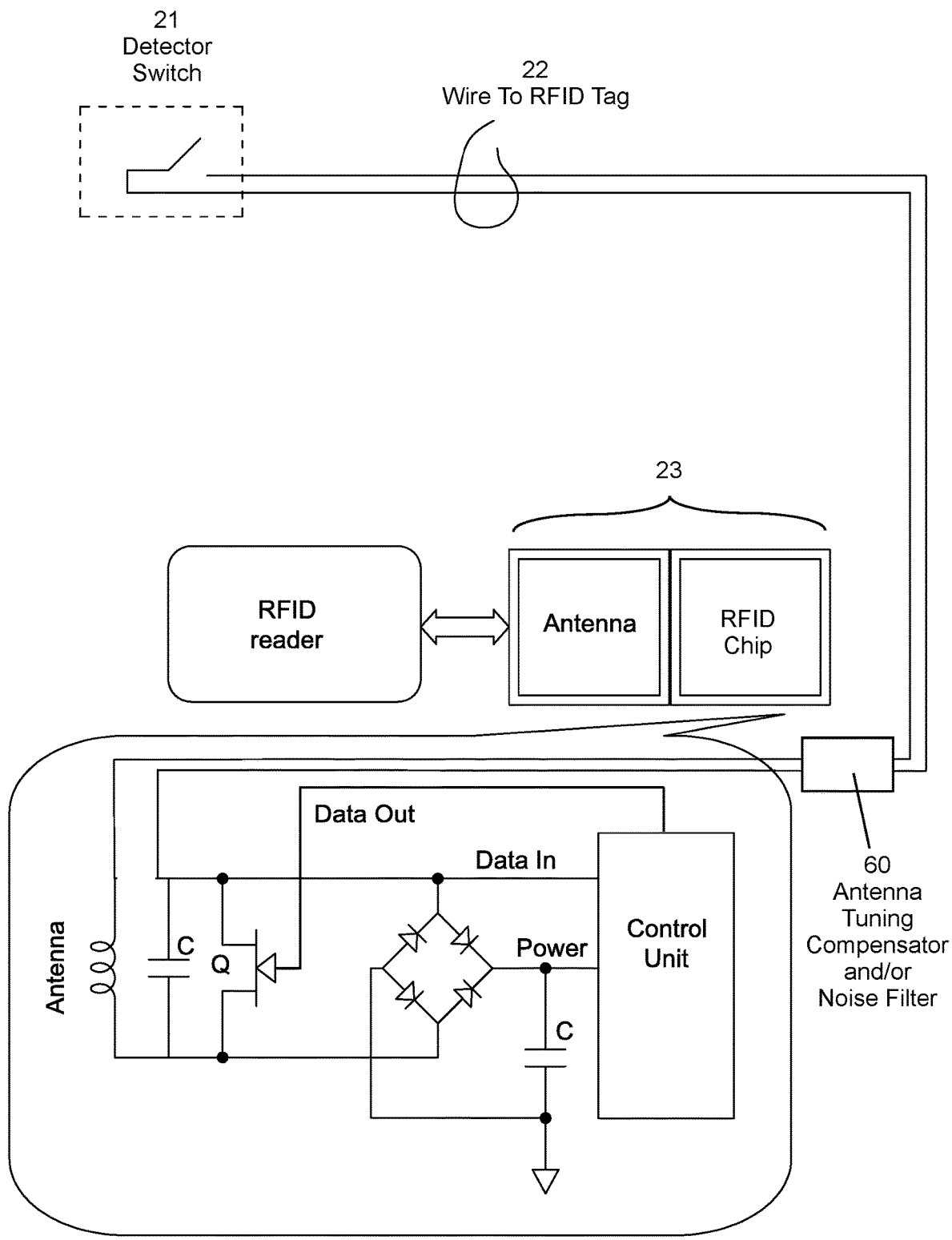
FIG. 6 is a schematic diagram of a second circuit technique for connecting an RFID status monitor to the disconnect switch blade closing detector.

FIG. 6 illustrates a second approach for connecting the detector switch 21 to the RFID tag 23, where the extended conductor 22 is connected to a form a switch in the antenna circuit of the RFID tag. In this embodiment, the power to the antenna of the RFID chip may be supplied only when the closing detector switch is in a closed position. This approach may not work well because the impedance of the long lead conductor changes the impedance of the antenna, effectively detuning the antenna. An antenna tuning compensator 60 connected to the conductor 22 may therefore be used to properly turn the RFID antenna in the presence of the extended conductor and the detector switch in this antenna configuration.

Figure 7:
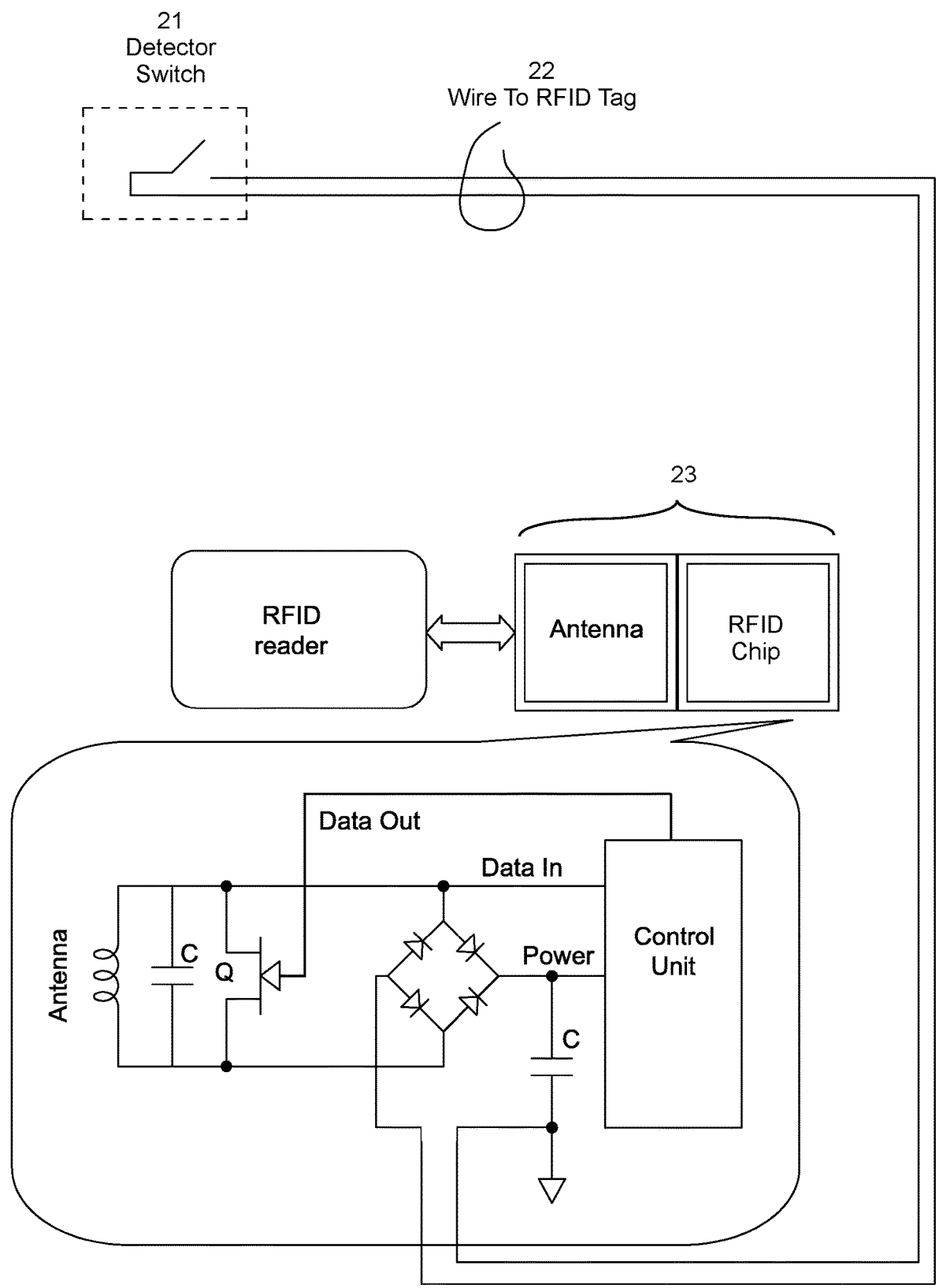
FIG. 7 is a schematic diagram of a third circuit technique for connecting an RFID status monitor to the disconnect switch blade closing detector.

FIG. 7 illustrates a different approach, where the extended conductor lead 22 is connected to selectively disconnect the ground to the DC power supply on the RFID tag 23 (typically a semiconductor rectifier bridge). In this embodiment, the extended conductor lead from the detector switch is used to selectively open the connection between the RFID power supply and ground. This causes the RFID tag to transmit only when the detector switch is closed. While this solution works, it may be difficult to locate and make an external connection to the DC power supply internal to the RFID chip.

Figure 8:
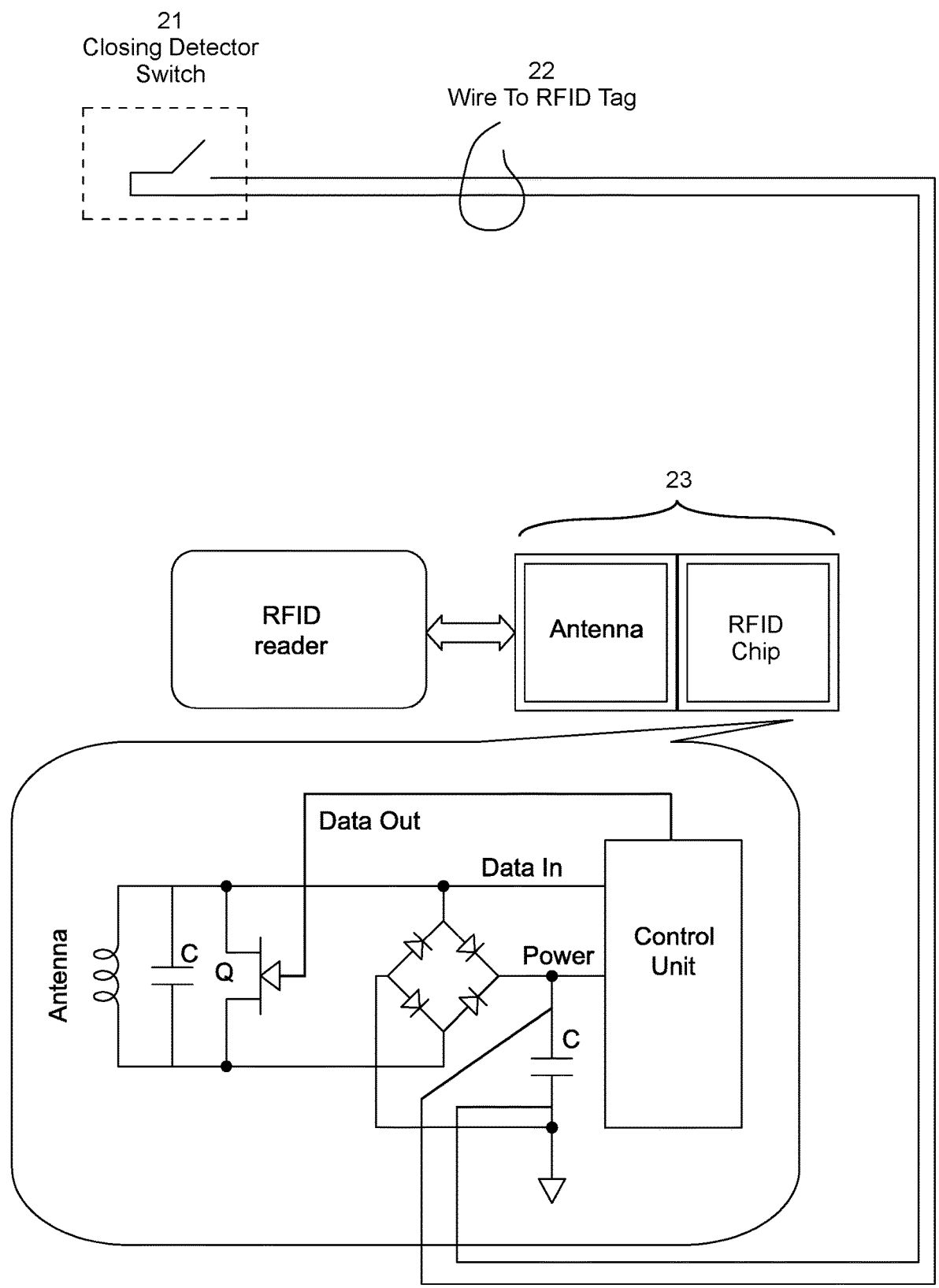
FIG. 8 is a schematic diagram of a fourth circuit technique for connecting an RFID status monitor to the disconnect switch blade closing detector.

FIG. 8 illustrates another approach, where the extended conductor lead 22 is connected to selectively short a ground-leg capacitor on the positive side of the power supply circuit on the RFID tag 23. In this embodiment, the extended conductor lead from the detector switch is used to selectively short a capacitor in the power supply circuit of an RFID tag, which causes the RFID tag to transmit only when the detector switch is open. Again, this solution works but it may be difficult to locate and make an external connection to an internal capacitor built into the RFID chip. In certain embodiments, the capacitor in the power supply circuit may be shorted by connecting two pins on the RFID chip. When this option is available, the embodiment shown in FIG. 8 provides a good option.

Figure 9:
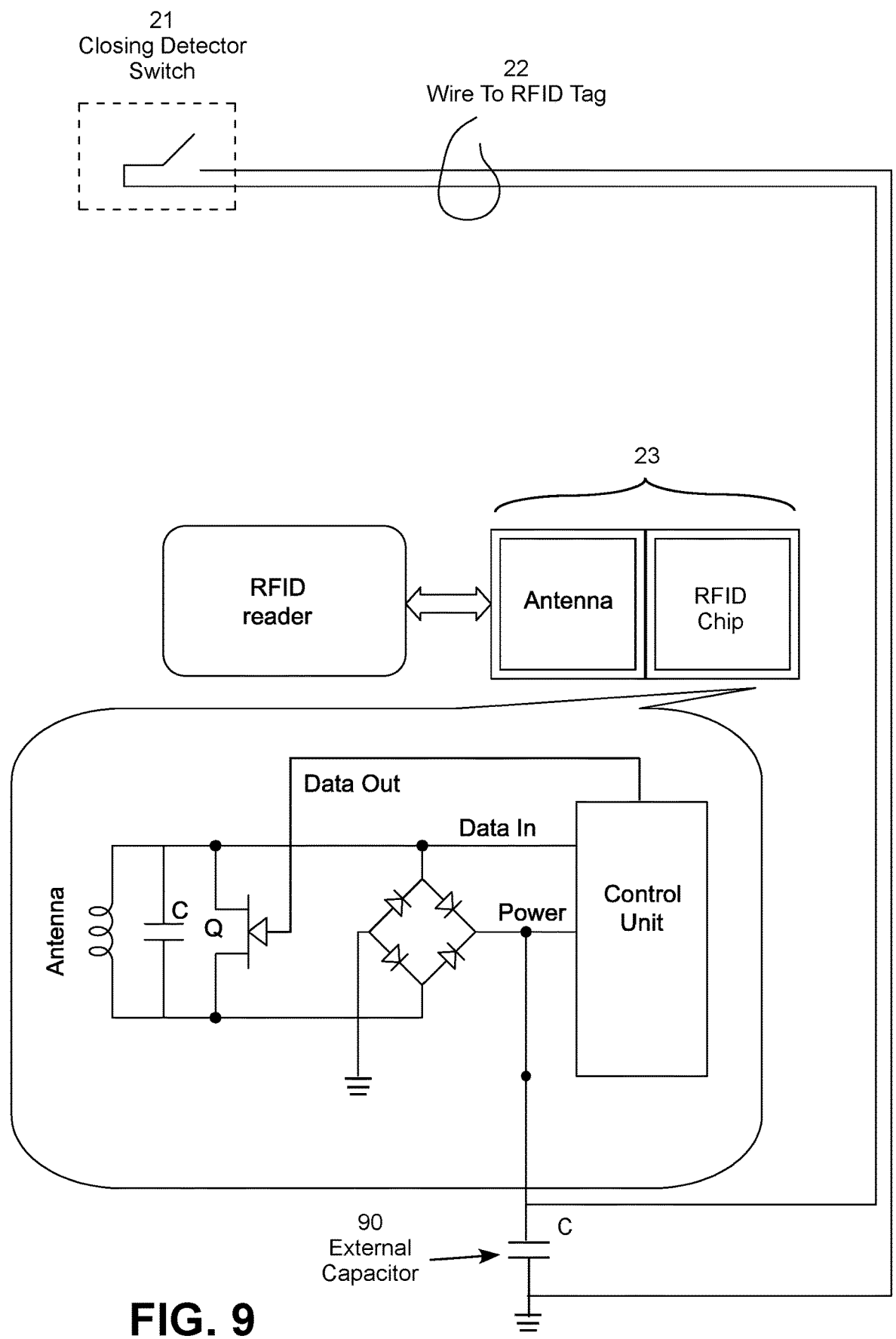
FIG. 9 is a schematic diagram of a fifth circuit technique for connecting an RFID status monitor to the disconnect switch blade closing detector.

FIG. 9 illustrates a variation of this approach, which may be preferred when pin access to the positive side of the power supply circuit of the RFID tag 23 is readily available. In this embodiment, the extended conductor lead 22 is connected to selectively short an external capacitor 90 on the positive side of the power supply circuit on the RFID tag 23. With pin access is available to the positive side of the power supply circuit, it is much easier to make the connection to the external capacitor. Again in this embodiment, the extended conductor lead from the detector switch is used to selectively short a capacitor on the positive side of power supply circuit of an RFID tag, effectively grounding the positive terminal of the DC power supply. This causes the RFID tag to transmit only when the detector switch is open. This solution is most readily available when the RFID tag is configured to utilize an external capacitor in the power supply circuit. This embodiment may therefore include creating or obtaining an RFID tag configured to utilize an external capacitor on the positive side of the DC power supply circuit of the RFID chip, which may be a special-order item. If this solution is not available, the approaches shown in FIGS. 5 through 8 and FIG. 10 may be utilized.

Figure 10:
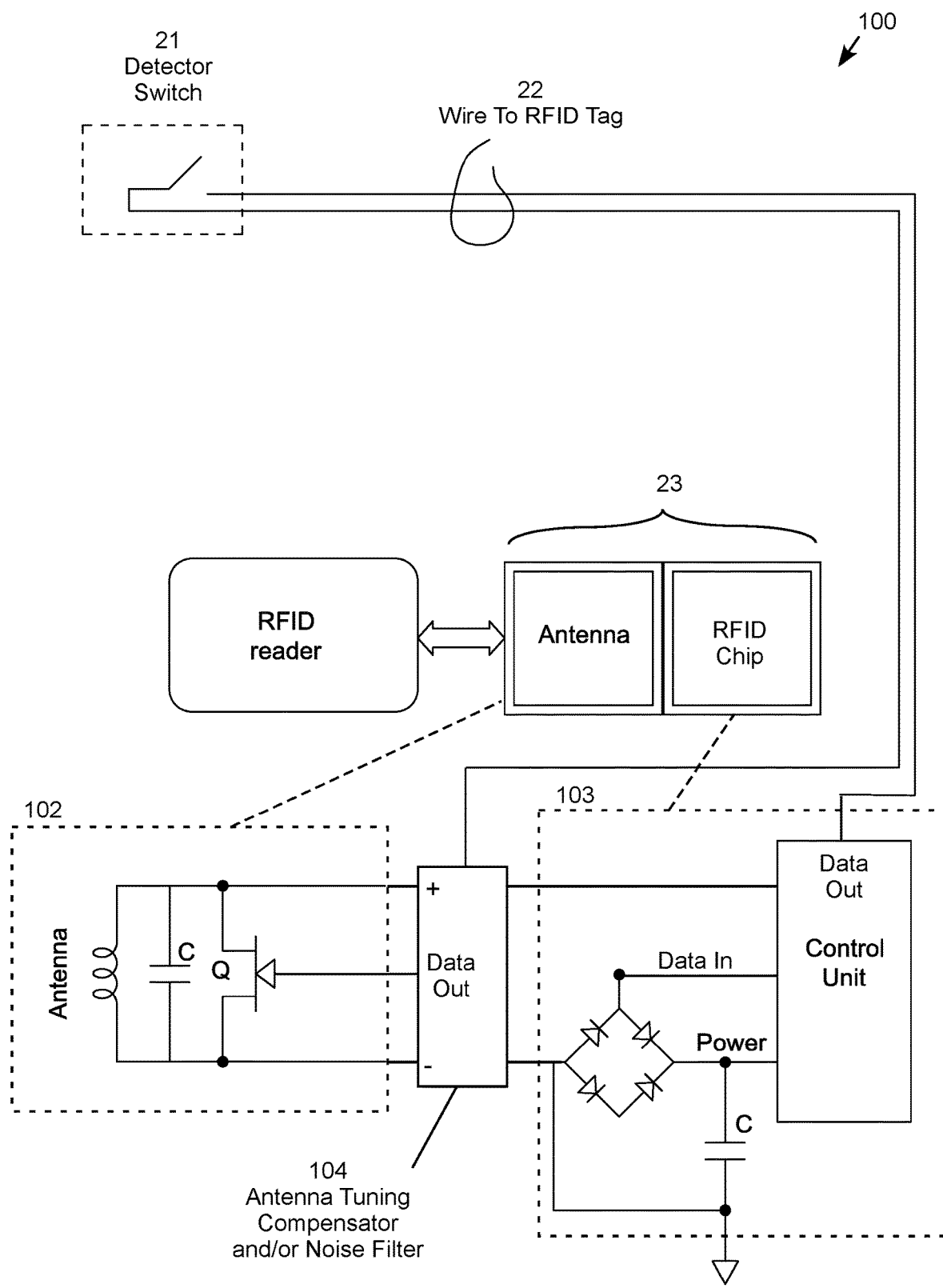
FIG. 10 is a schematic diagram of a sixth circuit technique for connecting an RFID status monitor to the disconnect switch blade closing detector.

FIG. 10 is a schematic diagram of a sixth approach 100 for connecting the detector switch 21 to the RFID tag 23. In this embodiment, the RFID tag 23 includes an antenna chip 102 that is physically distinct from an RFID chip 103. The extended conductor 22 through the detector switch 21 is connected to the data line of the RFID chip 23 extending between the control unit of the antenna chip 102 and the data line (transistor gate signal) of the RFID chip 103. In this embodiment, a data signal used to enable the RFID chip 23 may be supplied when the closing detector switch is in a closed position, or when the closing detector switch is in a closed position, as desired. The impedance of the long lead conductor 22 connected to the antenna chip 102 changes the impedance of the antenna, effectively detuning the antenna. An antenna tuning compensator 104 connected to the conductor 22 may therefore be used to properly turn the RFID antenna in the presence of the extended conductor and the detector switch in this antenna configuration. The antenna tuning compensator 104 may additionally or alternatively include a noise filter to improve the signal-to-noise ratio on the conductor 22. This approach is well suited to embodiments in which the RFID tag 23 includes an antenna chip 102 that is physically distinct from an RFID chip 103, which provides a convenient point of access for connecting the long conductor lead 22 to the RFID tag. This embodiment may alternatively include creating or obtaining an RFID tag configured to allow pin access to the antenna data line between the control unit of the RFID chip and the antenna gate, which may be a special-order item. In this case, the RFID chip and antenna may be, but need not be, physically distinct components because the chip pin access allows the lead 22 through the detector switch 21 to be connected between the control unit of the RFID chip and the antenna gate.

In view of the foregoing, it will be appreciated that present invention provides significant improvements in monitoring and response systems for high voltage electric power components and systems. The foregoing relates only to the exemplary embodiments of the present invention, and that numerous changes may be made therein without departing from the spirit and scope of the invention as defined by the following claims.

The invention claimed is:

1. A remote status detector for a high voltage electric component, comprising:
 a detector switch positioned on the high voltage electric component controlled by operation of the high voltage electric component;
 a RFID tag positioned remotely from the detector switch in a convenient reading location;
 an extended electric conductor connecting the detector switch to the RFID tag exposed to harsh electrical noise created by the high voltage electric component;
 wherein the detector switch is connected via the extended electric conductor to control the RFID tag.

2. The remote status detector of claim 1, wherein the RFID tag comprises an antenna chip that is physically distinct from a RFID chip, and the detector switch is connected via the extended electric conductor to a data line extending between the antenna chip and the RFID chip.

3. The remote status detector of claim 2, further comprising an antenna tuning compensator connected to the extended electric conductor.

4. The remote status detector of claim 3, further comprising a noise filter connected to the extended electric conductor.

5. The remote status detector of claim 1, wherein the high voltage electric component comprises an electric power disconnect switch.

6. The remote status detector of claim 1, wherein the detector switch is electrically connected via the extended electric conductor to provide a data signal to the RFID tag.

7. The remote status detector of claim 1, wherein the detector switch is electrically connected via the extended electric conductor to an antenna of the RFID tag.

8. The remote status detector of claim 1, wherein the detector switch is electrically connected via the extended electric conductor to a power supply of the RFID tag.

9. The remote status detector of claim 1, wherein the detector switch is electrically connected via the extended electric conductor to short a capacitor connected to a positive side of a power supply of a RFID chip so that power is supplied to the RFID chip only when the detector switch is in an open position.

10. A remote status detector for a high voltage electric power disconnect switch including jaws configured to receive a blade to selectively close the high voltage electric power disconnect switch, comprising:
 a detector switch positioned on or near the jaws of the high voltage electric power disconnect switch configured to be operated by receipt of the blade in the jaws;
 a RFID tag positioned remotely from the detector switch in a convenient reading location;
 an extended electric conductor connecting the detector switch to the RFID tag exposed to harsh electrical noise created by the high voltage electric power disconnect switch;
 wherein the detector switch is connected via the extended electric conductor to control the RFID tag.

11. The remote status detector of claim 10, wherein the RFID tag comprises an antenna chip that is physically distinct from a RFID chip, and the detector switch is connected via the extended electric conductor to a data line extending between the antenna chip and the RFID chip.

12. The remote status detector of claim 11, further comprising an antenna tuning compensator connected to the extended electric conductor.

13. The remote status detector of claim 12, further comprising a noise filter connected to the extended electric conductor.

14. The remote status detector of claim 10, wherein the detector switch is electrically connected via the extended electric conductor to provide a data signal to the RFID tag.

15. The remote status detector of claim 10, wherein the detector switch is electrically connected via the extended electric conductor to an antenna of the RFID tag.

16. The remote status detector of claim 10, wherein the detector switch is electrically connected via the extended electric conductor to a power supply of the RFID tag.

17. A method for detecting proper closing of an electric disconnect switch, comprising:
 positioning a detector switch on or near jaws of the electric disconnect switch configured to be operated by receipt of a blade in the jaws;
 positioning a RFID tag remotely from the detector switch in a convenient reading location;
 connecting an extended electric lead from the detector switch to the RFID tag in a position exposed to harsh electrical noise created by the electric disconnect switch;
 connecting the extended electric lead to control a power supply to the to the RFID tag.

18. The method of claim 17, wherein the RFID tag comprises an antenna chip that is physically distinct from a RFID chip, further comprising connecting the detector switch via the extended electric lead to a data line extending between the antenna chip and the RFID chip.

19. The method of claim 18, further comprising connecting an antenna tuning compensator to the extended electric lead.

20. The method of claim 19, further comprising connecting a noise filter to the extended electric lead.

* * * * *